US009231571B2

(12) United States Patent
Raghavan et al.

(10) Patent No.: US 9,231,571 B2
(45) Date of Patent: *Jan. 5, 2016

(54) RESONANT CLOCK AMPLIFIER WITH A DIGITALLY TUNABLE DELAY

(71) Applicant: Broadcom Corporation, Irvine, CA (US)

(72) Inventors: Bharath Raghavan, Irvine, CA (US); Jun Cao, Irvine, CA (US); Afshin Momtaz, Laguna Hills, CA (US)

(73) Assignee: Broadcom Corporation, Irvine, CA (US)

( * ) Notice: Subject to any disclaimer, the term of this patent is extended or adjusted under 35 U.S.C. 154(b) by 93 days.

This patent is subject to a terminal disclaimer.

(21) Appl. No.: 14/080,733

(22) Filed: Nov. 14, 2013

(65) Prior Publication Data

US 2014/0079169 A1    Mar. 20, 2014

Related U.S. Application Data

(63) Continuation of application No. 13/094,484, filed on Apr. 26, 2011, now Pat. No. 8,611,379.

(60) Provisional application No. 61/375,670, filed on Aug. 20, 2010.

(51) Int. Cl.
*H04J 3/04* (2006.01)
*H03K 5/07* (2006.01)
*H03M 9/00* (2006.01)
*H04L 7/02* (2006.01)
*H03K 5/00* (2006.01)
*H04L 7/00* (2006.01)

(Continued)

(52) U.S. Cl.
CPC . *H03K 5/07* (2013.01); *H03M 9/00* (2013.01); *H04L 7/02* (2013.01); *H03K 2005/00071* (2013.01); *H03K 2005/00208* (2013.01); *H04L 7/0079* (2013.01); *H04L 7/027* (2013.01); *H04L 7/033* (2013.01)

(58) Field of Classification Search
USPC .......... 370/503, 516, 517, 535, 536, 537, 542
See application file for complete search history.

(56) References Cited

U.S. PATENT DOCUMENTS 5,430,393 A * 7/1995 Shankar et al. ............... 327/142
5,892,797 A * 4/1999 Deng ........................... 375/361
5,999,027 A * 12/1999 Yamazaki .................... 327/161

(Continued)

*Primary Examiner* — Ricky Ngo
*Assistant Examiner* — Christine Ng
(74) *Attorney, Agent, or Firm* — McDermott Will & Emery LLP

(57) ABSTRACT

A programmable frequency receiver includes a slicer for receiving data at a first frequency, a de-multiplexer for de-multiplexing the data at a second frequency, a programmable clock generator for generating a clock at the first frequency, and first and second resonant clock amplifiers for amplifying clock signals at the first and second frequencies. The resonant clock amplifiers include an inductor having a low Q value, allowing them to amplify clock signals over the programmable frequency range of the receiver. The second resonant clock amplifier includes digitally tunable delay elements to delay and center the amplified clock signal of the second frequency in the data window at the interface between the slicer and the de-multiplexer. The delay elements can be capacitors. A calibration circuit adjusts capacitive elements within a master clock generator to generate a master clock at the first frequency.

20 Claims, 6 Drawing Sheets

(51) Int. Cl.
*H04L 7/027* (2006.01)
*H04L 7/033* (2006.01)

(56) References Cited

U.S. PATENT DOCUMENTS

| | | | |
|---|---|---|---|
| 6,346,830 B1 * | 2/2002 | Ishikawa | 326/93 |
| 6,769,082 B1 * | 7/2004 | Okayasu et al. | 714/738 |
| 6,867,630 B1 * | 3/2005 | Talledo et al. | 327/284 |
| 6,924,685 B2 * | 8/2005 | Bae | 327/276 |
| 7,075,347 B2 | 7/2006 | Athas | |
| 7,078,951 B2 * | 7/2006 | Gomm et al. | 327/261 |
| 7,106,655 B2 * | 9/2006 | Lee | 365/154 |
| 7,145,408 B2 | 12/2006 | Shepard et al. | |
| 7,579,905 B2 * | 8/2009 | Wu | 327/563 |
| 7,917,042 B2 * | 3/2011 | Adamiecki et al. | 398/202 |
| 8,229,367 B2 * | 7/2012 | Chan et al. | 455/78 |
| 8,611,379 B2 * | 12/2013 | Raghavan et al. | 370/535 |
| 2003/0179783 A1 * | 9/2003 | Uekama et al. | 370/535 |
| 2009/0096525 A1 * | 4/2009 | Staszewski et al. | 330/277 |
| 2009/0128210 A1 * | 5/2009 | Yamamoto | 327/202 |
| 2009/0154937 A1 * | 6/2009 | Lim et al. | 398/155 |

* cited by examiner

RESONANT CLOCK AMPLIFIER WITH A DIGITALLY TUNABLE DELAY

CROSS-REFERENCE TO RELATED APPLICATIONS

This application is a continuation of U.S. patent application Ser. No. 13/094,484, filed Apr. 26, 2011, entitled "Resonant Clock Amplifier with a Digitally Tunable Delay," now issued as U.S. Pat. No. 8,611,379, which claims priority to U.S. Provisional application Ser. No. 61/375,670, filed on Aug. 20, 2010, entitled "A Resonant Clock Amplifier With a Digitally Tunable Delay," both of which are hereby incorporated by reference in their entirety.

TECHNICAL FIELD

This application relates to resonant clock amplifiers having a digitally tunable delay, and to receivers having clocks that are distributed using resonant clock amplifiers having digitally tunable delays.

BACKGROUND

Receivers that receive data transmitted over high-speed serial links typically latch the incoming data using a slicer circuit that is driven by a clock running at either the full rate or half the rate of the incoming data stream. The latched data is then de-multiplexed in a de-multiplexer circuit that is driven by a clock running at a sub-multiple of the latching frequency. Typically, the same clock generating circuitry is used to generate both the latching and de-multiplexing clock signals, and these signals must be amplified to drive the substantial capacitive loads within the receiver. Typically, shunt-peaked amplifiers are used for this purpose.

FIG. 1 is a schematic illustration of a conventional clock distribution scheme using shunt-peaked amplifiers to distribute the clock signals needed by a receiver using a high speed de-multiplexer. As shown in FIG. 1, a frequency programmable receiver 100 receives a data stream 101. The data stream 101 is clocked into a slicer 130, consisting of flip-flops 131 and 132, using a clock signal 102b. In the full-rate clocked slicer 130 shown in FIG. 1, the period T of clock signal 102b matches the duration of bits in data stream 101. Clock signal 102b is derived from a clock signal 102 that is generated by a phase-locked loop (PLL) 110. The clock signal 102 output from PLL 110 is amplified by a shunt-peaked amplifier 120 to produce a clock signal 102b having sufficient amplitude to drive the capacitive load 105 of slicer 130. Slicer 130 produces an output data stream 101b that is subsequently de-multiplexed by a 1-2 de-multiplexer 170 at half the rate of data stream 101. De-multiplexer 170 consists of a first pair of latches 140/142 and a second group of latches 150/152/154 that latch every other bit in data stream 101b. That is, latches 140/142 latch the even bits in data stream 101b, while latches 150/152/154 latch the odd bits in data stream 101b. The latches 140/142 and 150/152/154 are driven by a clock signal 104b having a period 2T that is twice the period of clock signal 102b. Clock signal 104b is also derived from the clock signal 102 output by PLL 110 by a pair of latches 112/114 that divide clock signal 102 into a clock signal 104 that has twice the period of clock signal 102. Clock signal 104 is then amplified by a shunt-peaked amplifier 122 to produce clock signal 104b having sufficient amplitude to drive the capacitive load 106 presented by 1:2 de-multiplexer 170.

A significant draw-back to the clock distribution scheme shown in FIG. 1 is that shunt peaked amplifiers 120 and 122 consume significant power, especially when compared to other types of amplifiers such as resonant amplifiers. Despite this draw back, frequency programmable receivers such as receiver 100 are designed with shunt peaked amplifiers 120 and 122 rather than energy efficient resonant clock amplifiers because resonant clock amplifiers introduce frequency dependent time delays. These delays result in data synchronization issues whenever the frequency of the receiver 100 is changed.

As shown in FIG. 1, the frequency of receiver 100 can be programmed via one or more digital inputs 108 that allow the clock 102 generated by PLL 110 to have one of several programmable frequencies. When a new frequency for clock 102 is selected, a calibration block 160 (which can be internal or external to PLL 110), tunes a clock generation element within PLL 110 to generate clock 102 at the new frequency. For example, PLL 110 can include a tunable voltage controlled oscillator or VCO (not shown), such as an LC-tank VCO. Calibration block 160 can include a look-up table 180, indexed by the digital inputs 108, that stores one or more control words that can be output on control lines 161 through 165 to select the frequency of clock signal 102. For example, the control words can be used to change the capacitance of the LC-tank based VCO within PLL 110, thereby changing the oscillation frequency of the VCO and the clock signal 102 that is produced by PLL 110.

Frequency programmable receiver 100 also includes a clock and data recovery (CDR) circuit 190. Like the calibration block 160, CDR circuit 190 can be internal or external to PLL 110. In operation, CDR circuit 190 adjusts the phase of clock signal 102 so that amplified clock signal 102b is centered on the bit windows of data stream 101 at slicer 130. This ensures the correct latching of data bits in data stream 101 at slicer 130. By design, when receiver 100 is programmed to operate at its highest programmable frequency and CDR circuit 190 has centered amplified clock signal 102b on the bit windows of data stream 101 at slicer 130, amplified clock signal 104b is also centered on the bit windows of latched data stream 101b at de-multiplexer 170. When receiver 100 is programmed to operate at a lower frequency, CDR circuit 190 will generally re-adjust the phase of clock signal 102 to ensure that amplified clock signal 102b remains centered on the bit windows of data stream 101 at slicer 130. However, this re-adjustment can cause the misalignment of amplified clock signal 104b with respect to the bit windows of data stream 101b at de-multiplexer 170. To prevent this, the clock amplifiers 120 and 122, slicer 130, and latches 112/114 in receiver 100 are designed so that they introduce approximately equal delays into the clock signals 102b and 104b over the programmable frequency range of receiver 100. Since clock amplifier 120 amplifies a clock signal 102 that is twice the frequency of the clock signal 104 that is amplified by clock amplifier 122, this generally requires that the delays introduced by clock amplifiers 120 and 122 be essentially frequency independent over the programmable frequency range of receiver 100. While shunt-peaked amplifiers introduce such frequency independent delays, resonant clock amplifiers do not. Consequently, receiver 100 is designed to use shunt peaked amplifiers, despite the power savings that can be achieved using resonant clock amplifiers.

SUMMARY

A resonant clock amplifier with a digitally tunable delay, a receiver having a distributed clock signal that is amplified by a resonant clock amplifier with a digitally tunable delay, and a transmitter having a distributed clock signal that is amplified by a resonant clock amplifier with a digital tunable delay, substantially as shown and/or described in connection with at least one of the figures below, and as set forth more fully in the claims.

DETAILED DESCRIPTION

Figure 1:
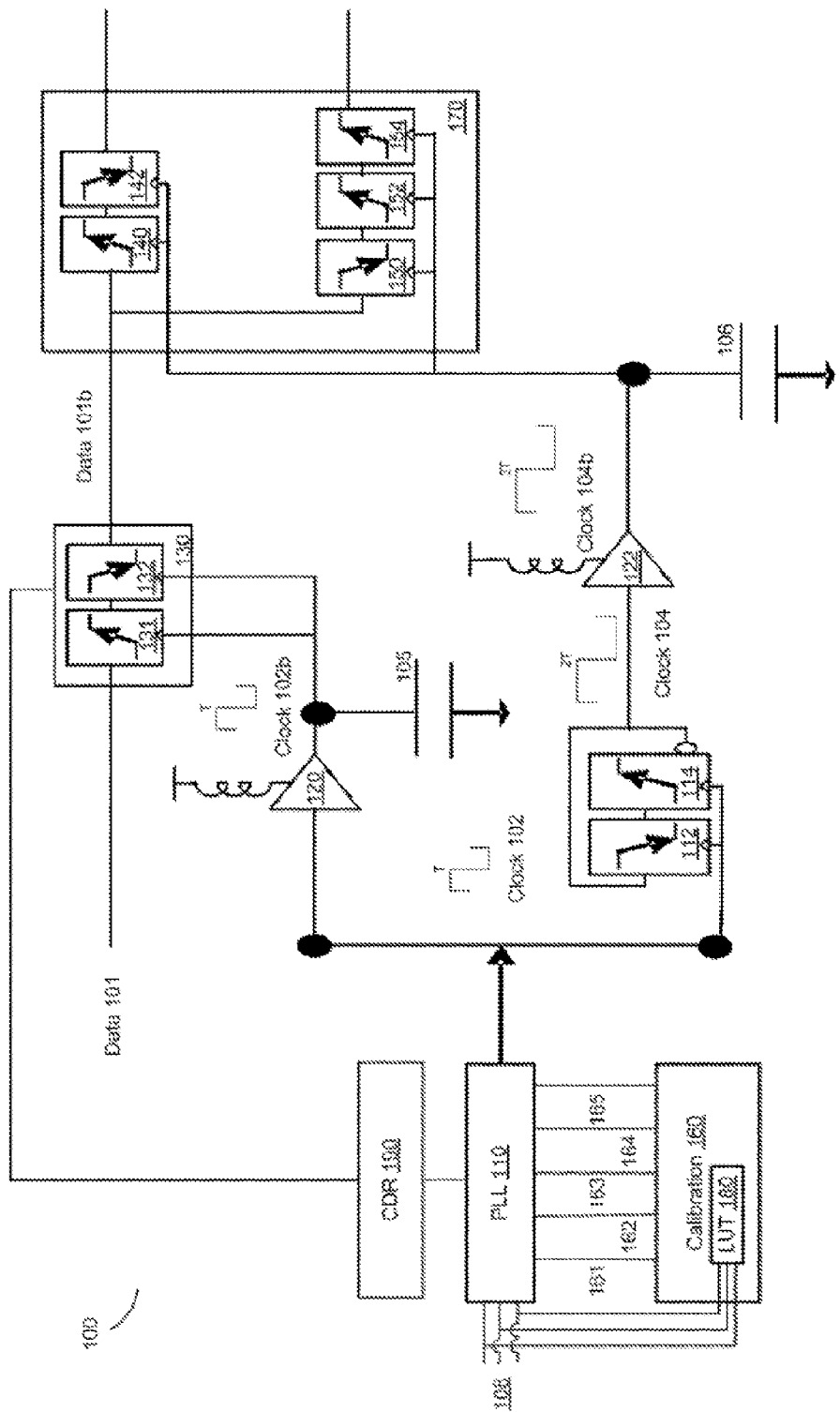
FIG. 1 is a schematic illustration of a conventional clock distribution scheme using shunt-peaked amplifiers to distribute the clock signals needed by a receiver containing a high speed 1:2 de-multiplexer.
Figure 2A:
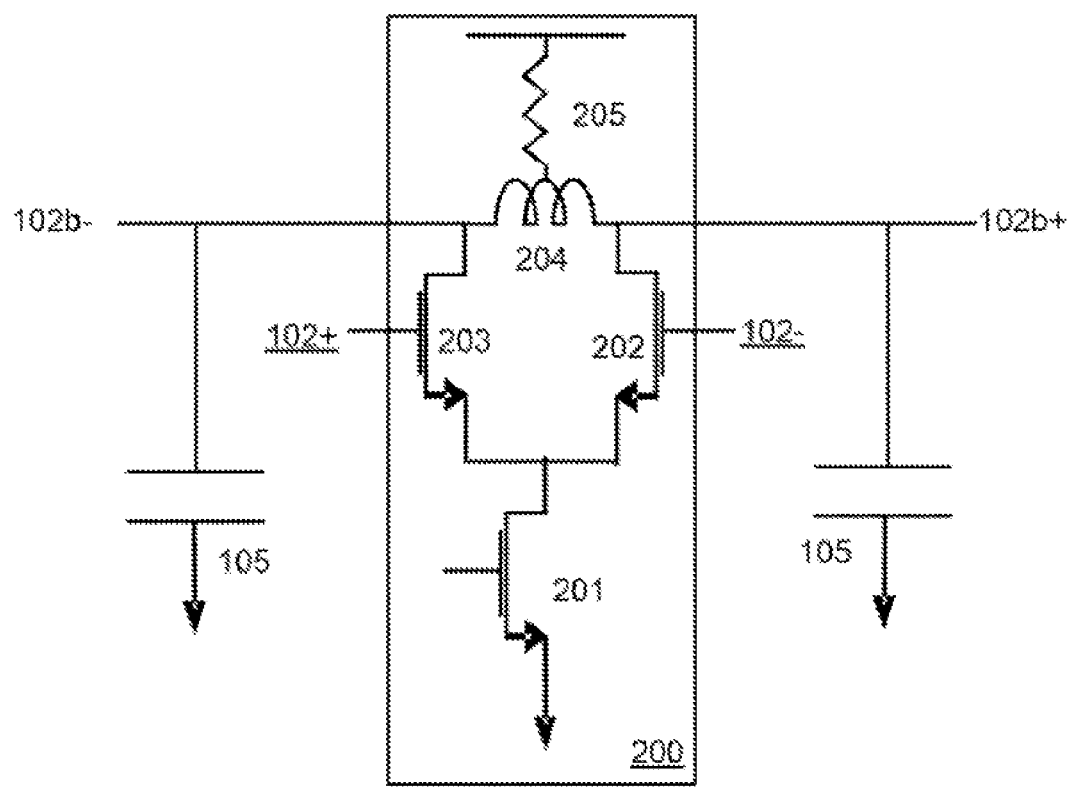
FIGS. 2A and 2B are schematic illustrations of a conventional resonant clock amplifier and its frequency response.
Figure 2B:
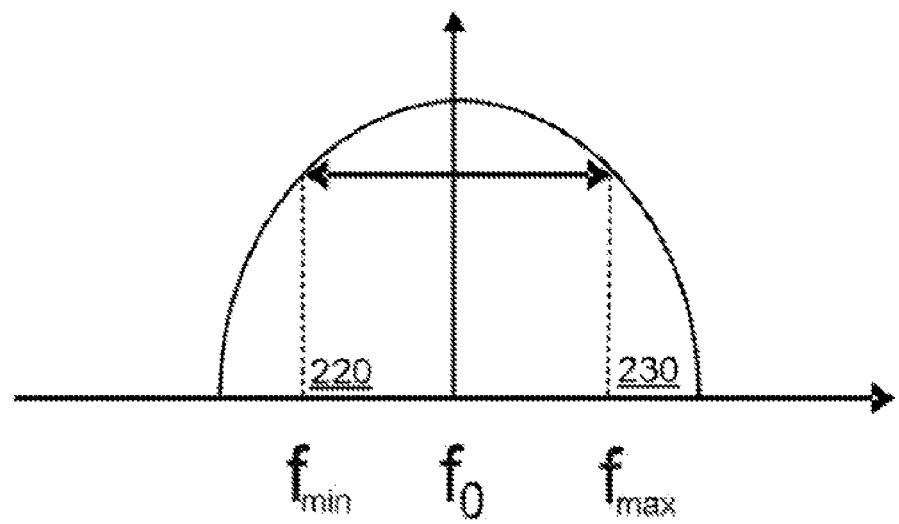

FIGS. 2A and 2B are schematic illustrations of a conventional resonant clock amplifier and its frequency response. The resonant clock amplifier 200 shown in FIG. 2A can be used, for example, to amplify the clock signal 102 in the receiver 400 shown in FIG. 4. Resonant clock amplifier 200 includes a differential pair of input transistors 202 and 203 that are coupled together at their sources. The sources of input transistors 202 and 203 are further commonly coupled to the drain of a tail transistor 201, which is configured to act as a constant current source for the differential input pair 202 and 203. The drains of input transistors 202 and 203 are coupled to capacitive loads 105 on each of the output nodes 102b+ and 102b−. The capacitive loads 105 can be, for example, the capacitive loads presented by the slicer circuit 130 shown in FIG. 1. The drains of input transistors 202 and 203 are further coupled to each other through an inductor 204, which is coupled to a power supply through a resistor 205.

The resonant clock amplifier 200 works as follows. Inductor 204 and capacitive loads 105 together constitute an LC-tank oscillator with a natural or resonant frequency of $\omega_0$=square root(LC), where L is the inductance of inductor 204 and C is the capacitance of capacitive loads 105. A differential clock signal 102+/102− drives the gates of the transistors 202 and 203 to periodically inject power from the power supply into the LC-tank oscillator. The injected power compensates for resistive losses within the LC-tank oscillator, thereby allowing the resonant clock amplifier 200 to achieve sustained oscillation at the driving frequency of the input clock signal 102+/102−.

To ensure resonant clock amplifier 200 has sufficient bandwidth to amplify any input clock signal 102+/102− within a programmable frequency range, the inductance L of inductor 204 is chosen so that the natural frequency of resonant clock amplifier 200 lies in the middle of that programmable frequency range, while the resistance of inductor 204 is chosen so that the gain or response of resonant clock amplifier 200 is appreciable over the entire programmable frequency range. This can be done by choosing an inductor 204 having a low Q or quality factor (i.e., a low ratio of reactance to resistance). The quality factor of inductor 204 thus determines the bandwidth or range of frequencies over which resonant clock amplifier 200 can produce an amplified differential clock signal 102b+/102b− from an input differential clock signal 102+/102−. To achieve sufficient bandwidth, an inductor 204 having a relatively poor quality factor is chosen. The frequency response or bandwidth of resonant clock amplifier 200 is described below in reference to FIG. 2B.

As shown in FIG. 2B, when inductor 204 has a relatively poor Q or quality factor (i.e., a low reactance to resistance ratio), resonant clock amplifier 200 can have an appreciable response over a broad range of input clock frequencies, for example, from a minimum frequency 220 to a maximum frequency 230. Thus, resonant clock amplifier 200 can amplify input clock signals that are generated over a broad programmable frequency range, such as the clock signals generated by a frequency programmable receiver. In general, the bandwidth of the resonant clock amplifier 200, when tuned to a center or resonant frequency $f_0$, can be approximately described as $2\pi f_0/Q$. With a small Q, resonant clock amplifier 200 can amplify input clock signals that are both higher and lower than its resonant frequency. However, when it does so, the generated output clock signal is generally phase-shifted with respect to the input clock signal. In particular, the output clock signal that is signal generated from an input clock signal that is slightly higher in frequency than the resonant frequency will have a small positive phase shift with respect to the input clock signal, while the output clock signal generated from an input clock signal that is slightly lower in frequency than the resonant frequency will have a small negative phase shift with respect to the input clock signal.

In general, when resonant clock amplifier 200 amplifies an input clock signal of a given frequency (and therefore of a given period T), the phase shift dT between the input clock signal and the output clock signal is proportional to the period. Thus, if a first resonant clock amplifier 200 amplified a first clock signal having a first period T (e.g., clock signal 102 shown in FIG. 1), it would introduce a first phase delay into the amplified clock signal (e.g., clock signal 102b) of dT. Similarly, if a second resonant clock amplifier 200 amplified a second clock signal having a second period 2T (e.g., clock signal 104 shown in FIG. 1), it would introduce a second phase delay into the amplified clock signal (e.g., clock signal 104b) of 2dT. Thus, the two resonant clock amplifiers would introduce a net or relative phase difference between the two clock signals of 2dT−dT=dT, which is proportional to the period (and therefore inversely proportional to the frequency) of the first input clock signal (e.g. clock signal 102). Thus, if two resonant clock amplifiers 200 were used in a programmable receiver such as the programmable receiver 400 shown in FIG. 4, at least one of the clock amplifiers would need to be modified to correct for the frequency dependent phase difference dT that would be introduced between the two amplified clock signals 102b and 104b at any programmable frequency of the programmable receiver 400. This is shown, for example, in FIG. 4, where two resonant clock amplifiers 200 and 500 are used to amplify different frequency clock signals 102 and 104, and where resonant clock amplifier 500 receives input signals 164 and 165 to compensate for the frequency dependent time delay that resonant clock amplifiers 200 and 500 introduce between the amplified clock signals 102b and 104b at any programmable frequency.

Figure 3A:
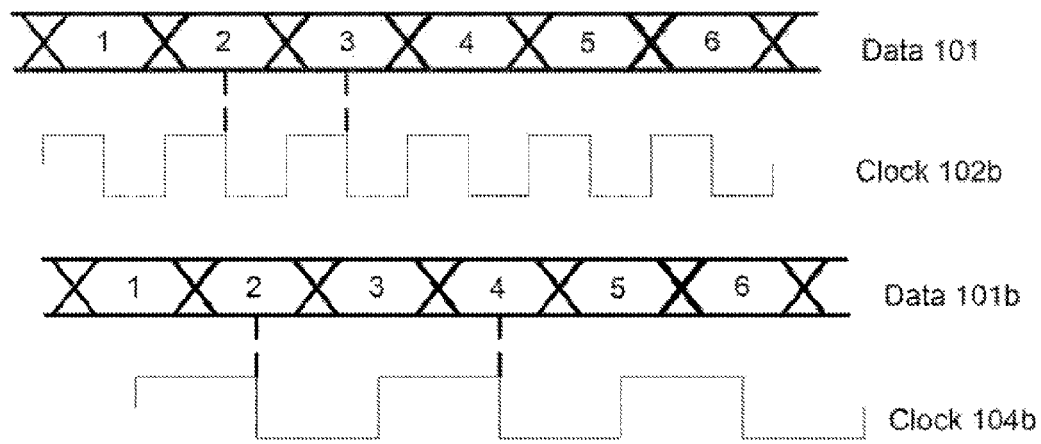
FIGS. 3A and 3B are schematic illustrations of the frequency dependent time delay that is introduced to the receiver shown in FIG. 1 when the shunt-peaked amplifiers are replaced with conventional resonant clock amplifiers.
Figure 3B:
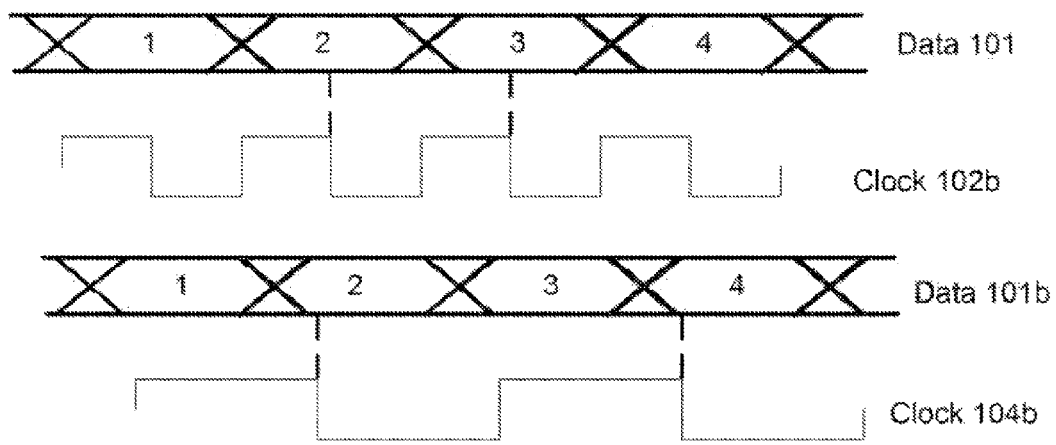

FIGS. 3A and 3B are schematic illustrations of the frequency dependent time delays that are introduced to the frequency programmable receiver shown in FIG. 1 when the shunt-peaked amplifiers 120 and 122 are replaced with conventional resonant clock amplifiers 200. As noted above, when shunt-peaked amplifiers 120 and 122 are replaced by two resonant clock amplifiers 200, one of which amplifies an input clock signal 102 that is twice the frequency of the input clock signal 104 that is amplified by the other, the resonant clock amplifiers 200 introduce a relative frequency dependent time difference between the amplified output clock signals 102b and 104b. As a result, though receiver 100 is designed so that amplified clock signals 102b and 104b are respectively aligned on the bit windows of the data stream 101 at slicer 130 and the data stream 101b at de-multiplexer 170 at a given frequency (e.g., the highest operating frequency of receiver 100), clock signal 104b will become misaligned with those bit windows at any other programmable frequency of receiver 100. If not corrected, this misalignment will introduce a timing error in receiver 100 at the interface between slicer 130 and de-multiplexer 170, and therefore a data reading error in receiver 100.

As shown in FIG. 3A, when receiver 100 (FIG. 1) is programmed to receive a data stream 101 at its highest programmable frequency, CDR circuit 190 (FIG. 1) will center the amplified clock signal 102b that is produced by a first resonant clock amplifier 200 in the bit windows of data stream 101 at slicer 130 (FIG. 1). The bit windows of the data stream 101b that is latched by slicer 130 will then be slightly offset from the bit windows of the input data stream 101 at de-multiplexer 170 (FIG. 1) due to the time delay introduced by slicer 130. Nonetheless, receiver 100 is designed so that when CDR circuit 190 centers the amplified clock signal 102b in the bit windows of data stream 101 at slicer 130, the amplified clock signal 104b produced by a second resonant clock amplifier 200 will also be centered on the bit windows of latched data stream 101b at de-multiplexer 170.

However, as shown in FIG. 3B, when receiver 100 is programmed to receive a lower frequency data stream 101 and CDR circuit 190 re-centers amplified clock signal 102b on the bit windows of lower frequency data stream 101 at slicer 130, amplified clock signal 104b will no longer be centered on the bit windows of latched data stream 101b at de-multiplexer 170. This is due to the relative frequency dependent time delay that is introduced between amplified clock signals 102b and 104b by resonant clock amplifiers 200, which cannot be compensated for by CDR circuit 190. As a result, amplified clock signal 104b becomes misaligned with respect to the bit windows of latched data stream 101b at de-multiplexer 170 as shown in FIG. 3B, and a timing error is introduced into receiver 100 at the interface between slicer 130 and de-multiplexer 170. To correct for this timing error, a programmable delay element must be introduced into at least one of the resonant clock amplifiers 200, as further explained below in reference to FIGS. 4 and 5.

Figure 4:
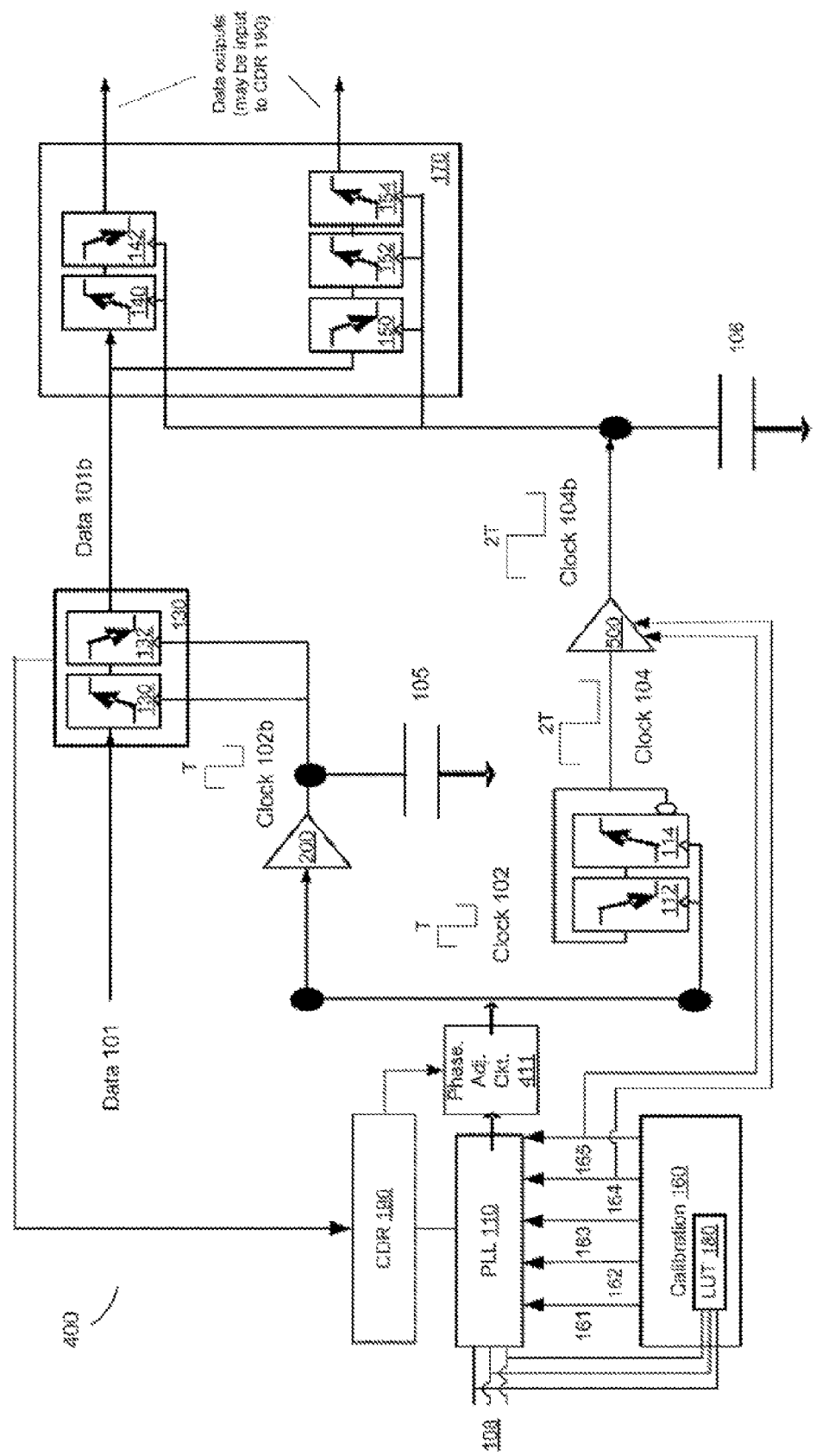
FIG. 4 is a schematic illustration of a clock distribution scheme using resonant clock amplifiers with a digitally programmable delay to distribute the clock signals needed by a receiver containing a high speed 1:2 de-multiplexer.

FIG. 4 is a schematic illustration of a clock distribution scheme using resonant clock amplifiers with digitally programmable delay to distribute the clock signals needed by a receiver containing a high speed 1:2 de-multiplexer.

According to an example implementation of receiver 400, PLL 110 may generate a variable frequency clock signal. A phase adjustment circuit 411 may be provided to adjust the phase of the clock signal output by PLL 110. Phase adjustment circuit 411 is coupled to an output of PLL 110 and to CDR 190. CDR 190 may control phase adjustment circuit 411 to (e.g., continuously) position (or control) the phase of the amplified clock signal 102b to be approximately centered within the data window of the input data stream 101 that is input to slicer circuit 130. In an example implementation, phase adjustment circuit 411 may be provided or implemented as a phase interpolator.

In an alternative implementation, CDR 190 may receive (as inputs) the demultiplexed data output from demultiplexer 170, rather than receive (as inputs) the data output from slicer circuit 130.

As shown in FIG. 4, the shunt-peaked amplifiers 120 and 122 (FIG. 1) used in the conventional receiver 100 (FIG. 1) have been replaced in receiver 400 with resonant clock amplifiers 200 and 500. As explained above, resonant clock amplifiers introduce frequency dependent time delays into the clock signals they amplify. Thus, when receiver 400 is programmed to operate at different frequencies, the edges of the amplified clock signals 102b and 104b that are respectively produced by the resonant clock amplifiers 200 and 500 shift by different amounts. To compensate for this relative phase shift (or frequency dependent delay), resonant clock amplifier 500 includes circuitry that can add a programmable delay to amplified clock signal 104b. In an example implementation, the circuitry within resonant clock amplifier 500, which may include one or more programmable delay elements, is responsive to a pair of control signals 164 and 165, which can be used to introduce a programmable delay into amplified clock signal 104b to re-align amplified clock signal 104b with the bit windows of data stream 101b input to de-multiplexer 170 when the frequency of receiver 400 is changed.

The one or more programmable (or selectable) delay elements provided within resonant clock amplifier 500 may be provided as one or more switchable capacitors, or multiple switchable capacitors, which may be controlled or selected in a discrete manner. Alternatively, the programmable delay elements may be provided as one or more varactors (variable capacitance devices), which may be controlled in a continuous manner. For example, in another example implementations, both of these techniques (switched capacitors and varactors) may be combined, e.g., where coarse programmable delay (or programmable capacitance) is controlled by selecting one or more switchable capacitors and fine programmable delay (or a fine programmable capacitance) is controlled or adjusted using analog control input to one or more varactors. These are merely a few example implementations, and other devices and implementations may be used to provide a programmable delay element(s).

The programmable delay element(s) may be provided in either resonant clock amplifier or both amplifiers. Thus, in one example implementation, the programmable delay elements are provided within resonant clock amplifier 500. However, in another example implementation, programmable delay elements may be provided within resonant clock amplifier 200.

In addition, adding capacitance (or capacitive delay) to a resonant amplifier (such as to a low-Q or low-quality resonant clock amplifier) can impact the signal amplitude of signals amplified and output by such resonant amplifier. As noted above, capacitance may be provided within one of the resonant clock amplifiers to compensate for a difference in delays caused by two resonant clock amplifiers or two clock paths. In one example embodiment, the programmable delay elements may be added to a resonant clock amplifier that is part of a lower frequency clock path because the impact (e.g., decrease) in clock signal amplitude due to the added capacitance may typically be less for a lower frequency signal. Therefore, according to an example implementation, programmable delay elements (e.g., switchable capacitors and/or varactors) may be added to or provided within resonant clock amplifier 500 that generates a clock signal 104b that may be a lower frequency as compared to the clock signal 102*b* in the signal path of resonant clock amplifier 200. Thus, it may be advantageous (at least in some cases) to provide programmable delay elements in the low (or lower) frequency clock path, e.g., for clock 104*b*.

As shown in FIG. 4, resonant clock amplifier 500 can receive control signals 164 and 165 from calibration logic 160. In one embodiment, control signals 164 and 165 are the two most significant bits from calibration logic 160. Of course, additional control signals can be used to program resonant clock amplifier 500, such as control signals 161 through 163. The additional control signals can be used to extend or to fine tune the delay that can be programmed into resonant clock amplifier 500. Other embodiments are also possible. For example, the control signals for resonant clock amplifier 500 can come from a different control element such as a separate lookup table (not shown) that contains the control bit(s) needed to program the delay element(s) in resonant clock amplifier 500. The look-up table can be indexed, for example, by the control signals 108 that are used to program the frequency of receiver 400, and can store one or more control signals that can be output to program one or more delay elements in resonant clock amplifier 500 in order to shift the edge of amplified clock signal 104*b* when the frequency of receiver 400 is changed.

Figure 5:
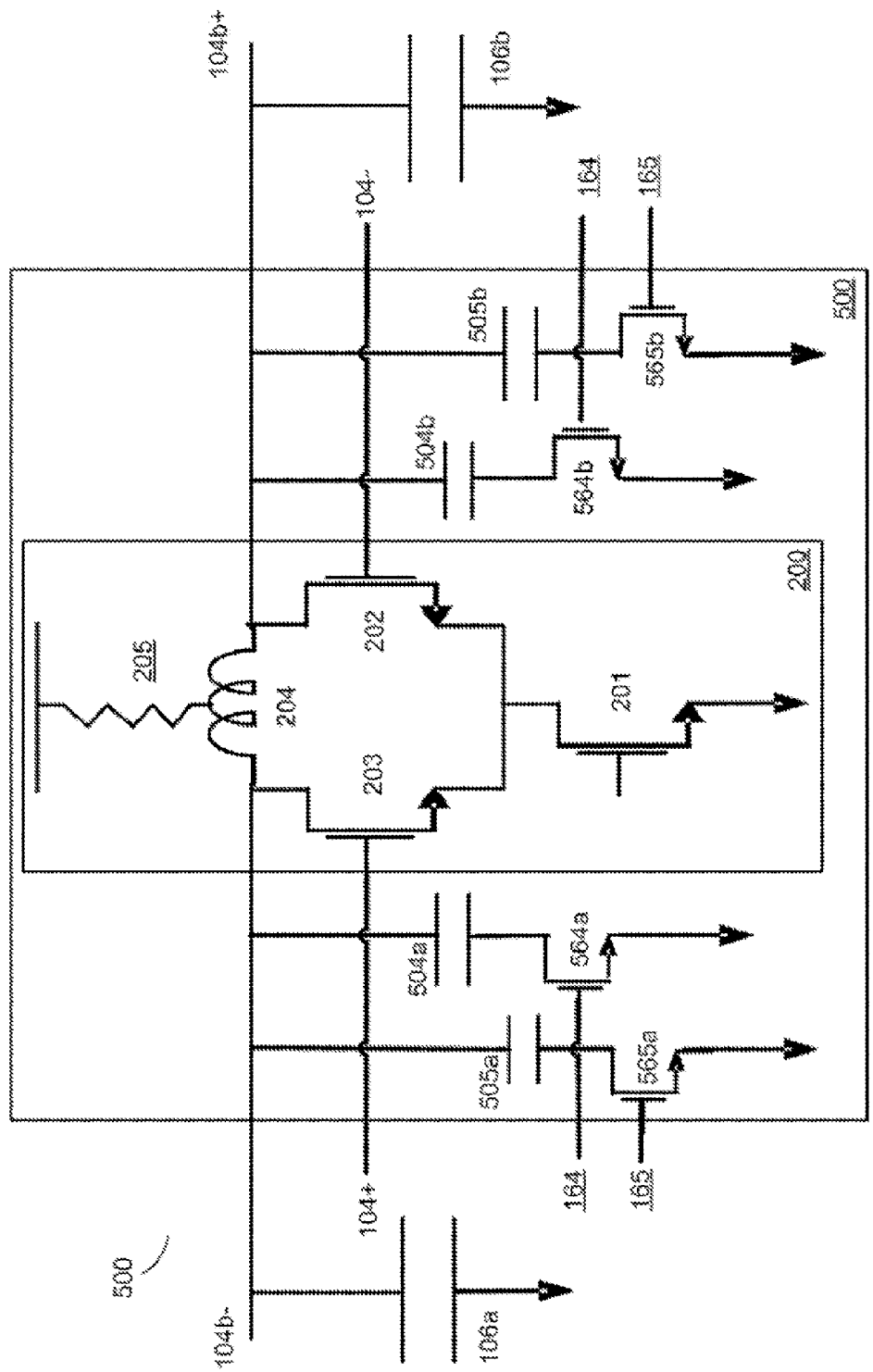
FIG. 5 is a schematic illustration of a resonant clock amplifier with a digitally programmable delay.

FIG. 5 is a schematic illustration of a resonant clock amplifier with a digitally programmable delay. The resonant clock amplifier 500 can be used, for example, in a frequency programmable receiver such as the receiver 400 shown in FIG. 4. Resonant clock amplifier 500 includes a core resonant clock amplifier 200 that is identical to and operates in the same manner as the resonant clock amplifier 200 described in FIGS. 2A and 2B above. In addition, resonant clock amplifier 500 includes a pair of capacitors 504*a/b* that are switchably coupled to the drains of the differential input pair of transistors 202 and 203 through a respective pair of coupling transistors 564*a/b*. Coupling transistors 564*a/b* receive a control signal 164, which can be one of the control signals produced by the calibration block 160 shown in FIG. 4. When control signal 164 is high, coupling transistors 564*a/b* respectively couple capacitors 504*a/b* to the drains of differential input transistors 202 and 203, thereby increasing the capacitive load that is driven by the core resonant clock amplifier 200. Similarly, resonant clock amplifier 500 includes a pair of capacitors 505*a/b* that are switchably coupled to the drains of the differential input pair of transistors 202 and 203 through a respective pair of coupling transistors 565*a/b*. Coupling transistors 565*a/b* receive a control signal 165, which can be another one of the control signals produced by the calibration block 160 shown in FIG. 4. When control signal 165 is high, coupling transistors 565*a/b* respectively couple capacitors 505*a/b* to the drains of differential input transistors 202 and 203, thereby also increasing the capacitive load that is driven by the core resonant clock amplifier 200.

As shown in FIG. 5, capacitor pairs 504*a/b* and 505*a/b* can be independently coupled to the drains of the differential input pair 202 and 203 through the coupling transistors 564*a/b* and 565*a/b*, respectively. Hence, resonant clock amplifier 500 can be made to drive a programmable capacitive load consisting of the core capacitive load provided by the capacitive pair 106*a/b*, and either no additional capacitive load or an additional capacitive load provided by the capacitive pair 504*a/b*, the capacitive pair 505*a/b*, or both of the capacitive pairs 504*a/b* and 505*a/b*. In general, the additional capacitive load provided by capacitive pairs 504*a/b* and 505*a/b* is much smaller than the capacitive load provided by the core capacitive pair 106*a/b*. As a result, when capacitive pairs 504*a/b* and 505*a/b* are programmably added to the core capacitive pair 106*a/b* (together or separately), the added capacitance introduces a small change to the resonant frequency of resonant clock amplifier 500, and more importantly a small phase or time delay to the amplified clock signal 104*b*+/104*b*− (shown as a single-ended signal 104*b* in FIG. 4) that is output by resonant clock amplifier 500. Thus, the edges of amplified clock signal 104*b* can be shifted by programmably adding the capacitive loads 504*a/b* or 505*a/b* to resonant clock amplifier 500.

Referring back to FIG. 4, when the operating frequency of receiver 400 is changed, different frequency dependent time delays are introduced into amplified clock signal 102*b* by resonant clock amplifier 200 and amplified clock signal 104*b* by resonant clock amplifier 500. These time delays shift the edges of amplified clock signals 102*b* and 104*b* from the centers of the bit windows in data streams 101 at slicer 130 and 101*b* at de-multiplexer 170, respectively. CDR circuit 190 can re-center the edges of amplified clock signal 102*b* on the bit windows of data stream 101 at slicer 130, e.g., by introducing a phase shift into the clock signal 102 that is produced by PLL 110. However, it cannot simultaneously re-center the edges of amplified clock signal 104*b* on the bit windows of data stream 101*b* at de-multiplexer 170. To do this, an additional delay must be introduced to amplified clock signal 104*b*. Referring back to FIG. 5, this can be done by adding one or more of the capacitive pairs 504*a/b* and 505*a/b* to the core capacitive pair 106*a/b* in resonant clock amplifier 500. In general, the amount of added capacitance is chosen to re-center the edges of amplified clock signal 104*b* on the bit windows of data stream 101*b* at de-multiplexer 170.

Referring again to FIG. 4, a pair of input control signals 164 and 165 from calibration logic 160 can be used to program the delay that is introduced into amplified clock signal 104*b* by resonant clock amplifier 500. As discussed above, when receiver 400 is programmed to receive data stream 101 at a new frequency, calibration logic 160 determines the control signals (e.g., from LUT 180) that are needed to generate the clock signal 102 from PLL 110 at that frequency. This frequency change introduces different frequency dependent time delays into amplified clock signals 102*b* and 104*b*, thereby shifting the edges of amplified clock signals 102*b* and 104*b* from the bit windows of input data streams 101 at slicer 130 and 101*b* at de-multiplexer 170, respectively. While clock and data recovery circuit 190 can subsequently adjust the phase of clock signal 102 to re-center the edges of amplified clock signal 102*b* on the bit windows of data stream 101 at slicer 130, it cannot simultaneously re-center the amplified clock signal 104*b* on the bit windows of data stream 101*b* at de-multiplexer 170. To do this, one or more of the control signals produced by calibration logic 160 are used to add one or more delay elements to resonant clock amplifier 500 (e.g., capacitive pairs 504*a/b* and 505*a/b*). The added delay elements shift the phase of the amplified clock signal 104*b* that is produced by the resonant clock amplifier 500 to re-center amplified clock signal 104*b* on the bit windows of data stream 101*b* at de-multiplexer 170.

While certain features of the programmable delay resonant clock amplifier and the frequency programmable receiver with programmable delay resonant clock amplifiers have been illustrated as described herein, many modifications, substitutions, changes and equivalents will occur to those skilled in the art. For example, the programmable delay resonant clock amplifier 500 can include additional delay elements that can be switchably connected to the core resonant clock amplifier 200 via additional control lines. The additional delay elements can be used to increase the programmable delay of resonant clock amplifier 500 or to more finely tune the programmable delay of resonant clock amplifier 500. The delay elements can be one or more switchable capacitors such as capacitors 504 and 505 controlled discretely using digital control signals, or other types of continuous delay elements constructed using variable capacitance elements such as varactors controlled by an analog control signal or by a combination of discrete and continuous capacitance control. The control signals that are used to determine the programmable delay of resonant clock amplifier 500 can be derived from a control element other than calibration logic 160. For example, resonant clock amplifier 500 can have its own delay calibration logic, which can be, for example, an independent lookup table that is indexed by the control signals 108 that program the frequency of receiver 400. The indexed elements of the independent lookup table can store the control signals that are needed to programmable the delay in resonant clock amplifier 500.

The receiver 400 shown in FIG. 4 is designed so that clocks 102*b* and 104*b* are respectively centered in the bit windows of data 101 at slicer 130 and data 101*b* at de-multiplexer 170 when the receiver 400 is operating at its highest operating frequency. Circuitry is then added to the resonant clock amplifier 500 (which amplifies the lower frequency clock signal 104) to add additional delay to the amplified clock signal 104*b* when the frequency of programmable receiver 400 is lowered. In an alternative embodiment, receiver 400 can be designed so that clocks 102*b* and 104*b* are respectively centered in the bit windows of data 101 at slicer 130 and data 101*b* at de-multiplexer 170 when the receiver 400 is operating at its lowest operating frequency. In this embodiment, circuitry can be added to the resonant clock amplifier 200 (which amplifies the higher frequency clock signal 102) to add additional delay to the amplified clock signal 102*b* when the frequency of programmable receiver 400 is raised.

Figure 6:
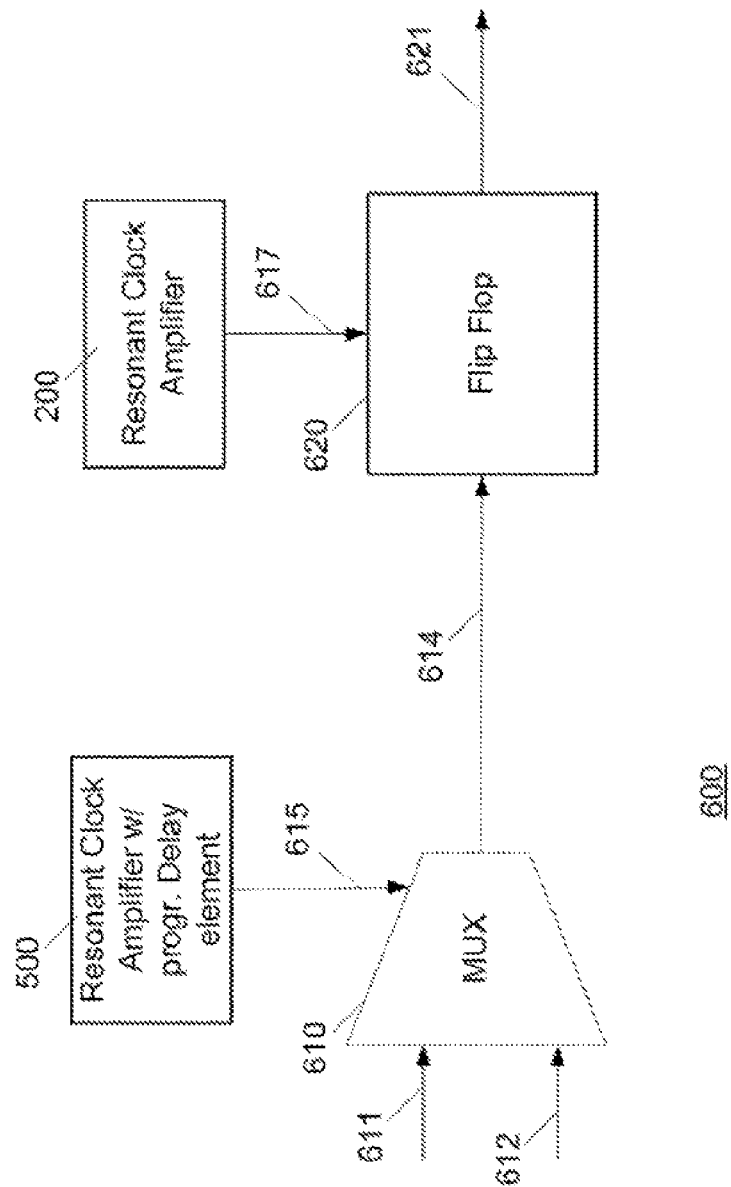
FIG. 6 is a block diagram of a clock distribution scheme using resonant clock amplifiers with a digitally programmable delay to distribute the clock signals needed by a transmitter containing a high speed 2:1 multiplexer.

FIG. 6 is a block diagram of a clock distribution scheme using resonant clock amplifiers with a digitally programmable delay to distribute the clock signals needed by a transmitter containing a high speed 2:1 multiplexer. The techniques described above for providing a programmable delay in a receiver that uses resonant clock amplifiers may also be used for transmitters. As shown in FIG. 6, a transmitter 600 includes a 2:1 multiplexer (MUX) circuit 610 that combines (or multiplexes) multiple data signal inputs, including a first data signal input provided via line 611 and a second data signal input provided via line 612. For example, two lower data rate data input signals may be multiplexed or combined by MUX circuit 610 to output a higher data rate multiplexed data signal.

A first amplified clock signal is generated by resonant clock amplifier 500 and output onto line 615, and input as a select line into MUX 610. Resonant clock amplifier 500 has a programmable delay element, as described above. MUX circuit 610 multiplexes or combines the two (or multiple) data inputs at times or at a rate determined by the first amplified clock signal output from resonant clock amplifier. The multiplexed data signal is output from MUX circuit 610 via line 614 to flip-flop (or other memory element or another multiplexer) 620. The resonant clock amplifier 500 amplifies a first clock signal at a first programmable frequency.

Flip-flop (or other memory element or another multiplexer) 620 may latch the multiplexed data signal output from MUX circuit 610 at times or at a rate determined by a second amplified clock signal received via line 617 that was produced by resonant clock amplifier 200. As noted above, the resonant clock amplifier 200 amplifies a second clock signal at a second programmable frequency that is a multiple of the first programmable frequency (e.g., the second frequency may be 2×, 3×, 4×, . . . N× . . . etc., the first programmable frequency). As noted above, resonant clock amplifier 500 may include one or more programmable delay elements to delay the amplified clock signals to compensate for a frequency dependent time delay introduced between the first and second amplified clock signals by the first and second resonant clock amplifiers (200, 500), according to an example implementation.

While the various circuits described herein have been shown and described as differential circuits, it will apparent to one of skill in the art that the circuits described can also be implemented as single ended circuits.

It is to be understood that these, and other such changes and modifications that would be familiar to a person of ordinary skill in the art, fall within the scope of the appended claims, which are intended to cover all such modifications and embodiments.

What is claimed is:

1. A device comprising:
   a clock circuit comprising amplifiers, at least one of the amplifiers being a resonant amplifier, the clock circuit being configured to produce amplified clock signals derived from a source clock signal, wherein the amplified clock signals comprise at least one amplified and programmably delayed clock signal;
   a first circuit configured to latch an input data stream using a first amplified clock signal produced by the clock circuit, the first amplified clock signal having a first frequency; and
   a second circuit that is electrically coupled to the first circuit, the second circuit configured to demultiplex the data stream latched by the first circuit using at least a second amplified clock signal produced by the clock circuit, the second amplified clock signal having a second frequency that is less than the first frequency.

2. The device of claim 1, wherein the second amplified clock signal comprises the at least one amplified and programmably delayed clock signal and the first frequency is equivalent to a source frequency of the source clock signal.

3. The device of claim 1, wherein the clock circuit is configured to adjust a delay associated with the at least one amplified and programmably delayed clock signal by adjusting a capacitance.

4. The device of claim 1, wherein the clock circuit is configured to adjust a delay associated with the at least one amplified and programmably delayed clock signal when a source frequency of the source clock signal changes.

5. The device of claim 1, wherein the resonant amplifier is associated with a tunable delay element.

6. The device of claim 5, wherein the clock circuit is configured to adjust a delay associated with the at least one amplified and programmably delayed clock signal by adjusting the tunable delay element.

7. The device of claim 6, wherein the tunable delay element comprises a variable capacitor that is adjustable by an analog control signal.

8. The device of claim 7, further comprising:
   a calibration circuit that is configured to generate the analog control signal.

9. The device of claim 1, further comprising:
   a clock and data recovery (CDR) circuit that is configured to adjust a phase of the first amplified clock signal.

10. The device of claim 1, wherein the clock circuit comprises at least one of a phase interpolator, a VCO, or a LC-tank circuit.

11. The device of claim 1, wherein the resonant amplifier comprises:

an input pair of transistors, each having a source, a gate, and a drain, wherein the sources of the input pair of transistors are coupled to each other and to ground, the gates are configured to receive an input clock signal at the second frequency that less than the first frequency, and the drains are configured to output the second amplified clock signal to drive a capacitive load;

an inductor coupled between the drains of the of the input transistors; and a resistor, coupled between the inductor and a power supply.

12. The device of claim 11, wherein the resonant amplifier further comprises:

a first pair of delay elements, coupled to the drains of the input pair of transistors by a respective first pair of coupling transistors and configured to delay output of the amplified clock signal when the first pair of coupling transistors receive a control signal to couple the first pair of delay elements to the drains of the input pair of transistors.

13. The device of claim 12, wherein the first pair of delay elements comprise a first pair of capacitors.

14. The device of claim 12, wherein the resonant amplifier further comprises:

a second pair of delay elements, coupled to the drains of the input pair of transistors by a respective second pair of coupling transistors and configured to independently delay output of the second amplified clock signal when the second pair of coupling transistors receive the control signal to couple the second pair of delay elements to the drains of the input pair of transistors.

15. The device of claim 1, wherein the first circuit comprises a slicer circuit and the second circuit comprises a demultiplexer circuit.

16. A device comprising:

a clock circuit comprising amplifiers, at least one of the amplifiers being a resonant amplifier, the clock circuit being configured to produce amplified clock signals derived from a source clock signal, wherein the amplified clock signals comprise at least one amplified and programmably delayed clock signal;

a first circuit configured to multiplex a plurality of data signals using a first amplified clock signal produced by the clock circuit to generate a multiplexed data signal, the first amplified clock signal having a first frequency; and a second circuit configured to latch the multiplexed data signal using a second amplified clock signal produced by the clock circuit independently of the first amplified clock signal, the second amplified clock signal having a second frequency.

17. The device of claim 16, wherein the second frequency is greater than the first frequency.

18. The device of claim 16, wherein the resonant amplifier is associated with a tunable delay element and the clock circuit is configured to adjust a delay associated with the at least one amplified and programmably delayed clock signal by adjusting the tunable delay element.

19. A method comprising:

latching an input data stream at a first circuit driven by a first amplified clock signal produced by a first resonant amplifier amplifying a first clock signal derived from a clock source at a first frequency;

receiving the input data stream latched by the first circuit at a second circuit driven by at least a second amplified clock signal produced by a second resonant amplifier amplifying a second clock signal derived from the clock source at a second frequency that is less than the first frequency, wherein the at least one of the first or second resonant amplifiers is configured to amplify and programmably delay the first or second clock signals, respectively; and programmably adjusting a delay of the first or second clock signals when a source frequency of the clock source changes.

20. The method of claim 19, wherein the second frequency is less than the first frequency.

* * * * *